(12) United States Patent
Tschischgale et al.

(10) Patent No.: US 7,733,501 B2
(45) Date of Patent: Jun. 8, 2010

(54) OPTICAL SYSTEM OF A MICROLITHOGRAPHIC PROJECTION EXPOSURE APPARATUS

(75) Inventors: Joerge Tschischgale, Dresden (DE); Toralf Gruner, Aalen-Hofen (DE)

(73) Assignee: Carl Zeiss SMT AG, Oberkochen (DE)

( * ) Notice: Subject to any disclaimer, the term of this patent is extended or adjusted under 35 U.S.C. 154(b) by 12 days.

(21) Appl. No.: 12/195,920

(22) Filed: Aug. 21, 2008

(65) Prior Publication Data

US 2009/0015845 A1 Jan. 15, 2009

Related U.S. Application Data

(63) Continuation of application No. 11/190,555, filed on Jul. 27, 2005, now Pat. No. 7,423,765.

(30) Foreign Application Priority Data

Jul. 31, 2004 (DE) .................... 10 2004 037 278

(51) Int. Cl.
*G01B 11/02* (2006.01)
(52) U.S. Cl. ..................................... 356/513
(58) Field of Classification Search .................. 356/53, 356/511, 513, 485, 508
See application file for complete search history.

(56) References Cited

U.S. PATENT DOCUMENTS

| | | | | |
|---|---|---|---|---|
| 3,418,052 A * | 12/1968 | Hoffmann | ................... | 356/123 |
| 4,022,532 A | 5/1977 | Montagnino | | |
| 4,303,341 A * | 12/1981 | Kleinknecht et al. | ........ | 356/636 |
| 4,536,086 A * | 8/1985 | Shemwell | ................... | 356/458 |
| 4,725,144 A | 2/1988 | Nelson | | |
| 5,142,132 A | 8/1992 | MacDonald et al. | | |
| 5,260,761 A * | 11/1993 | Barker | ........................ | 356/4.1 |
| 5,467,191 A * | 11/1995 | Kishner | ....................... | 356/513 |
| 5,477,393 A * | 12/1995 | Sasaki et al. | ................. | 359/846 |
| 5,748,323 A * | 5/1998 | Levinson | ..................... | 356/399 |
| 5,757,505 A * | 5/1998 | Mizutani | ..................... | 356/400 |
| 5,784,164 A * | 7/1998 | Deck et al. | ................... | 356/511 |
| 5,793,473 A | 8/1998 | Koyama et al. | | |
| 5,805,273 A | 9/1998 | Unno | | |
| 6,040,909 A * | 3/2000 | Hasegawa et al. | ............ | 356/614 |
| 6,154,279 A * | 11/2000 | Thayer | ........................ | 356/602 |
| 6,262,792 B1 * | 7/2001 | Higashiki | ...................... | 355/52 |
| 6,293,027 B1 | 9/2001 | Elliott et al. | | |
| 6,388,823 B1 | 5/2002 | Gaber et al. | | |
| 6,417,916 B1 | 7/2002 | Dengler et al. | | |

(Continued)

*Primary Examiner*—Gregory J Toatley, Jr.
*Assistant Examiner*—Scott M Richey
(74) *Attorney, Agent, or Firm*—Fish & Richardson P.C.

(57) ABSTRACT

In a method for improving imaging properties of an illumination system or a projection objective of a microlithographic projection exposure apparatus, which comprises an optical element having a surface, the shape of the surface is measured directly at various points. To this end, a measuring beam is directed on the points, and the reflected or refracted beam is measured, e.g. using an interferometer. Based on deviations of the measured shape from a target shape, corrective measures are derived so that the imaging errors of the optical system are improved. The corrective measures may comprise a change in the position or the shape of the optical element being analyzed, or another optical element of the optical system. The target shape of the surface may, for example, be determined so that the optical element at least partially corrects imaging errors caused by other optical elements.

23 Claims, 3 Drawing Sheets

U.S. PATENT DOCUMENTS

| | | |
|---|---|---|
| 6,717,679 B2 | 4/2004 | Kuchel |
| 6,775,007 B2 | 8/2004 | Izatt et al. |
| 6,784,977 B2 * | 8/2004 | von Bunau et al. ............ 355/67 |
| 6,842,255 B2 | 1/2005 | Ohsaki et al. |
| 7,423,765 B2 * | 9/2008 | Tschischgale et al. ....... 356/513 |
| 2003/0003023 A1 | 1/2003 | Korpela |
| 2003/0234993 A1 | 12/2003 | Hazelton |
| 2005/0170748 A1 * | 8/2005 | Enkisch et al. ................. 451/5 |

* cited by examiner

OPTICAL SYSTEM OF A MICROLITHOGRAPHIC PROJECTION EXPOSURE APPARATUS

CROSS-REFERENCE TO RELATED APPLICATIONS

This application is a continuation of U.S. patent application Ser. No. 11/190,555 filed Jul. 27, 2005 which claims priority of German patent application 10 2004 037 278.0, filed Jul. 31, 2004 both prior applications full disclosures are incorporated herein by reference.

BACKGROUND OF THE INVENTION

1. Field of the Invention

The invention relates to optical systems, for example projection objectives or illumination systems, of microlithographic projection exposure apparatuses as are used for the production of microstructured components. The invention also relates to a method for improving imaging properties of such optical systems.

2. Description of Related Art

Microlithographic projection exposure apparatuses, which are used for the production of large-scale integrated electrical circuits and other microstructured components, contain an illumination system which is used to generate a projection light beam. The projection light beam is directed at a mask, which contains minute structures to be imaged and is arranged in an object plane of a projection objective. The projection objective forms a reduced image of the structures contained in the mask on a photosensitive layer, which is located in an image plane of the projection objective and may, for example, be applied on a wafer.

Owing to the small size of the structures to be imaged, very stringent requirements are placed on the imaging properties of the projection objective, and increasingly of the illumination system. Imaging errors of these optical systems must therefore be reduced to a tolerable level by suitable measures.

In this context, it has been known for a long time to change the position of individual optical elements inside the relevant optical system with the aid of manipulators. Such position changes, however, can only correct a few imaging errors retrospectively. Further imaging errors can be corrected by changing the shape of optical elements, or more precisely their reflective or refractive surfaces.

In connection with lenses, for example, it is known from U.S. Pat. No. 6,388,823 B1 assigned to the applicant to bend a lens without significantly changing its thickness. To this end, the lens is engaged circumferentially by a plurality of actuators which generate the intended bending moments in the lens.

EP 1 376 192 A2 discloses a projection objective of a microlithographic projection exposure apparatus, which is constructed exclusively using mirrors. Two of the mirrors can be deformed so that their reflecting surfaces respectively change in shape. Various configurations of actuators which can provide an intended deformation of the mirror surface are also described.

Optical elements with deliberately deformable surfaces, which are often also referred to as active or adaptive optical elements, are also suitable for correcting those imaging errors which vary as a function of time. For example, there are imaging errors which are due to changes in refractive index and/or shape, which are in turn a result of heat produced in the optical elements by the projection light. The energetic projection light can furthermore lead to irreversible material modifications at those places on the optical elements which are exposed to the projection light. It is also known that the shape of optical elements can even change because of settling and relaxation effects when they are not exposed to projection light.

When time-variable imaging errors, attributable to the aforementioned or similar causes, are intended to be corrected by changing the shape of individual surfaces during operation of the projection exposure apparatus, then the corrective measures must be designed so that they can be implemented as much as possible in short exposure pauses. Corrective measures which require longer down times of the apparatus reduce the throughput and therefore compromise their economic viability.

In connection with projection objectives, it has therefore been proposed to analyze the imaging properties of the projection objective during exposure. It is known, for example from US Patent Application 2003/0002023 A1 assigned to the applicant, to couple a measuring light beam into the projection objective so that it lies outside the actual projection light beam after it emerges from the projection objective. The emergent measuring light beam is analyzed with the aid of a wavefront detector, so that it is possible to infer the imaging properties at least of that part of the projection objective through which the measuring light beam has passed. On the basis of these measurements, corrective measures can then be determined which inter alia may comprise changing the shape of adaptive lenses or adaptive mirrors. A similar method is also known from EP 1 376 192 A2, which was already mentioned above.

Such known measuring methods, however, can quantitatively register only some specific imaging errors. The causes explained above may, however, also induce time-variable imaging errors which cannot be analyzed during projection operation by the known method.

SUMMARY OF THE INVENTION

It is therefore an object of the invention to provide an optical system of a microlithographic projection exposure apparatus having improved correction possibilities. It is also an object of the invention to provide a method by which the imaging properties of such a system can be improved further.

An optical system which achieves this object comprises an optical element that has a surface which is exposed to projection light during a projection. According to the invention, a measuring device is provided that determines positional data of at least one point on the surface. If positional data are determined for more than that one point, it is possible to compute the shape of the surface. The more points that are included in the determination, the better the computed shape corresponds to the actual shape of the surface. The positional data may comprise coordinates of the point relative to a reference system, for example, or distances to a point of reference.

The invention is based on the discovery that the optical effect of an optical element can be determined optimally by directly determining the shape of an optically active surface of the optical element with a high accuracy. If it is found when determining the shape of the surface that the deviations from a target shape exceed a predetermined amount, then suitable corrective measures may be instigated. These may, for example, comprise using suitable manipulators which are known as such to change the position or shape of the optical element being analyzed or, if this is not possible or not expedient for other reasons, another optical element.

According to previously known methods, it is possible to determine the imaging properties of the overall optical system within certain limits by processing the images obtained with a measuring light beam which has passed through a multiplicity of individual optical elements. With these known methods, however, it is often difficult or even impossible to locate the causes of particular imaging errors and, in particular, infer the deformation of individual surfaces. This is a disadvantage because many imaging errors can only be corrected sufficiently by knowing which optically active surfaces exhibit deviations from a target shape. In contrast, the method according to the invention makes it possible to directly determine deformations of virtually any optically active surfaces, which offers considerably improved correction possibilities.

The target shape, with which the measured shape of the surface is compared, may for example be determined so that the optical element causes minimal imaging errors. This is generally the shape on which the design of the optical system was based.

As an alternative to this, the target shape may also be determined so that the optical element at least partially corrects imaging errors which are caused by other optical elements, and which may possibly not occur until operation of the exposure apparatus. For example, if the optical element is a concave mirror in a catadioptric projection objective, which is arranged in or close to a pupil plane of the system, then many time-variable imaging errors can be substantially corrected at a central point in the projection objective by selectively changing the shape of the surface of the concave mirror.

The shape of the surface being analyzed may be changed with the aid of manipulators. In this case, the manipulators may be driven so that deviations of the measured shape from the target shape lie below a predeterminable threshold value. To this end, the measuring device may be connected to a control device for at least one manipulator which affects the shape of the surface, and to which a target shape of the surface can be delivered as a guide quantity. In the scope of a control process, it is thus possible to bring the actual measured shape of the surface closer and closer to the target shape.

In this configuration, the invention therefore makes it possible to monitor the effect of the manipulators directly on the relevant optical element. This is advantageous in so far as the manipulators used for this purpose do often generate control messages, from which it is possible to infer which position the manipulators have reached and which shape the surface should therefore have. However, it is often not possible to infer the actual shape of the surface accurately enough from the control messages alone. The causes of these inaccuracies may, for example, be drift effects of measuring devices which are assigned to the manipulators.

In general, the optical elements contained in the optical system often fall significantly short of their potential to cause imaging errors because of energetic projection light or similar causes. A thin plane-parallel plate, which is arranged in an optical system so that projection light passes through it uniformly over a sizeable area, will generally induce smaller time-variable imaging errors than, for example, is the case with a strongly curved lens through which the projection light passes with a very small beam diameter. In more complex optical systems, for example projection objectives in general, it is therefore sufficient to carry out the inventive direct measurement of one or more optically active surfaces only on a few optical elements or even a single optical element.

Furthermore, it is generally unnecessary to record the entire optically active surface precisely in terms of measuring technology. In order to obtain information about changes in the imaging behavior, which are caused by passive or active shape changes, it is often sufficient to obtain positional data at a few points or even only at a single point on the surface. When this description refers to measuring the shape of the surface directly, therefore, this consequently also includes the situation in which the height of a surface relative to a plane perpendicular to the optical axis is determined only at one or more individual points. The term direct measurement thus does not include measurements in which the shape of the surface is merely inferred indirectly from the overall optical effect, i.e. by simulation. Instead, direct measurement means to directly obtain positional data, e.g. the height relative to a plane perpendicular to the optical axis, for one or more individual points on the surface.

An interferometric measuring device, in which a measuring beam that strikes the surface interferes with a reference beam that does not strike the surface, is particularly suitable for analyzing the surface. Interferometric measuring devices can achieve very high measurement accuracies; such measuring devices furthermore allow a compact structure, so that they can also be integrated in projection objectives with their spatial limitations.

An interferometric measuring device typically comprises a light source for generating coherent light and an interferometer. The wavelength of the light used is preferably independent of the wavelength of the projection light, so that the light generated by the light source does not itself lead to exposure of the photosensitive layer applied on the wafer, even if a small part of the light used for the measurement enters the projection light beam path by scattering or the like. In principle, it is also possible to extract a part of the projection light which is generated by the laser contained in the illumination device, and to use this for the interferometric analysis of the surface. This is suitable particularly when the relevant optical element is arranged in the illumination device of the projection exposure apparatus.

When selecting the wavelength of the measuring light it should also be borne in mind that the surface to be analyzed must reflect the measuring beam. For refractive optical elements, which generally have an anti-reflection coating on their surfaces, there are usually wavelengths at which the anti-reflection coating does not work. If such a wavelength is selected for the measuring beam, then it is possible to ensure that a sufficiently large part of the incident measuring beam will be reflected.

In order to be able to direct the measuring beam at different points on the surface of the optical element, the measuring device may furthermore contain at least one tiltable deviating mirror. The deviating mirror may be tilted continuously or intermittently about one or more spatial axes, so that the measuring beam can be directed at a multiplicity of points on the surface to be analyzed.

Instead of an interferometric measuring arrangement, it is also conceivable to use other optical measuring arrangements which can analyze surfaces accurately. For example, it is possible to use triangulation measuring methods and methods which are based on the auto-focus principle, as is known for instance from optical data memory readers.

BRIEF DESCRIPTION OF THE DRAWINGS

Various features and advantages of the present invention may be more readily understood with reference to the following detailed description taken in conjunction with the accompanying drawings, in which.

DESCRIPTION OF PREFERRED EXEMPLARY EMBODIMENTS

Figure 1:
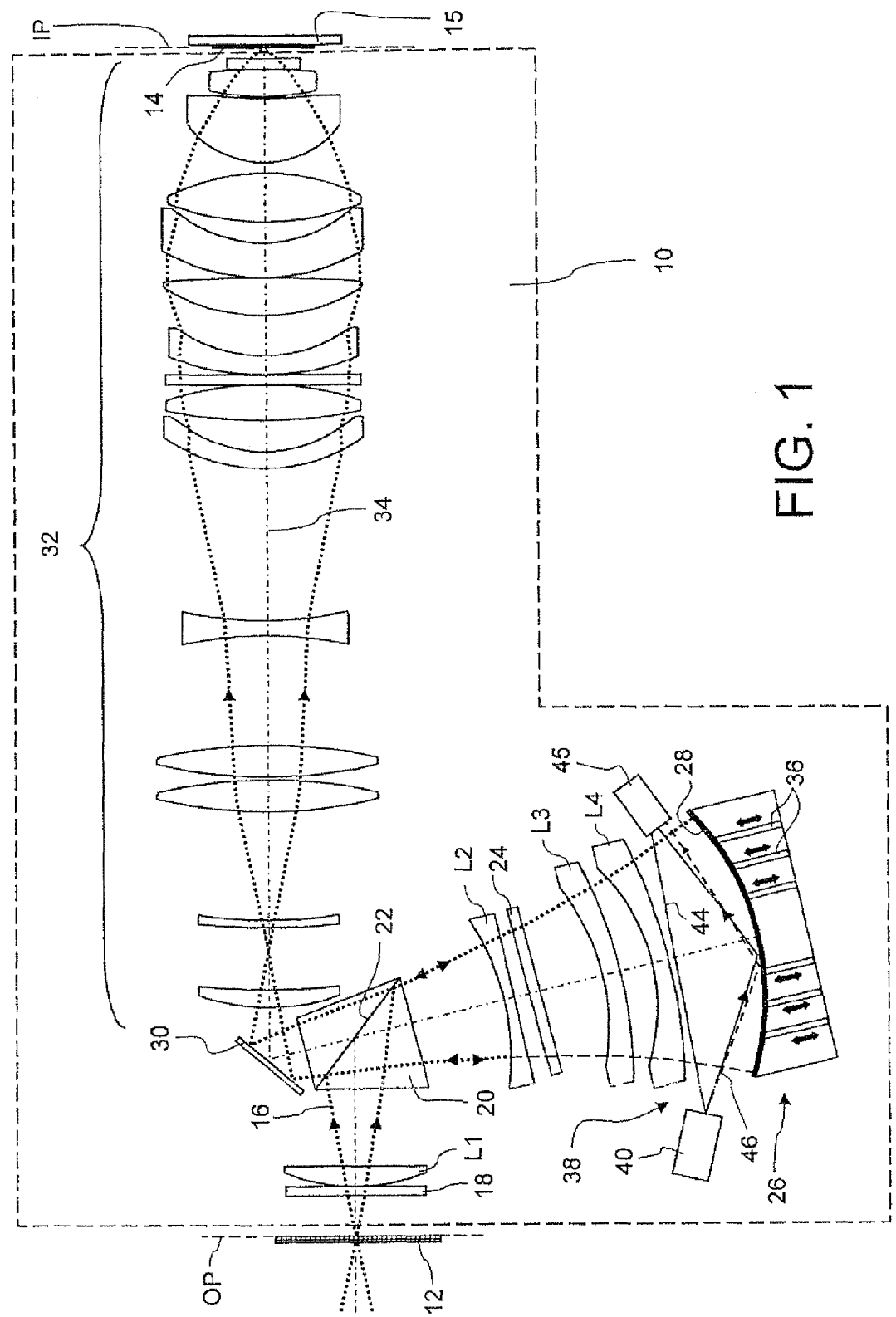
FIG. 1 shows a meridian section through a projection objective of a microlithographic projection exposure apparatus in a highly schematized representation, with an interferometric measuring device for analyzing a mirror surface.

FIG. 1 represents a projection objective, denoted in its entirety by 10, of a microlithographic projection exposure apparatus in a simplified meridian section. The projection objective, which is also described in PCT/EP03/04015 filed by the applicant, is used to form a reduced image of structures, contained in a mask 12, onto a photosensitive layer 14 which consists of a photoresist and is applied on a substrate 15. The mask 12 is arranged in an object plane OP and the photosensitive layer 14 is arranged in an image plane IP of the projection objective 10.

After passing through the mask 12, the projection light 16 indicated by dots in FIG. 1, which is generated by an illumination system of the projection exposure apparatus and has a wavelength of 157 nm in the exemplary embodiment represented, travels through a plane-parallel plate 18 and a lens L1 into a beam-splitter cube 20. There, the projection light 16 is reflected at a polarization-selective beam-splitter layer 22 contained in it, and sent through a lens L2, a quarter-wave plate 24 and two further lenses L3 and L4 onto a mirror unit 26 explained in detail below, which comprises an adaptive mirror with an essentially spherical mirror surface 28.

After reflection at the mirror surface 28, the projection light again passes through the lenses L4 and L3, the quarter-wave plate 24 and the lens L2, and strikes the polarization-selective beam-splitter layer 22. There, however, the projection light 16 is not reflected but transmitted since the polarization direction of the projection light 16 has been rotated through 90° by passing twice through the quarter-wave plate 24. From the beam-splitter cube 20, the projection light 16 travels via a plane mirror 30 into a purely dioptric part 32 of the projection objective 10 in which lenses (not referred to in detail) are arranged along an optical axis indicated by 34.

Figure 2:
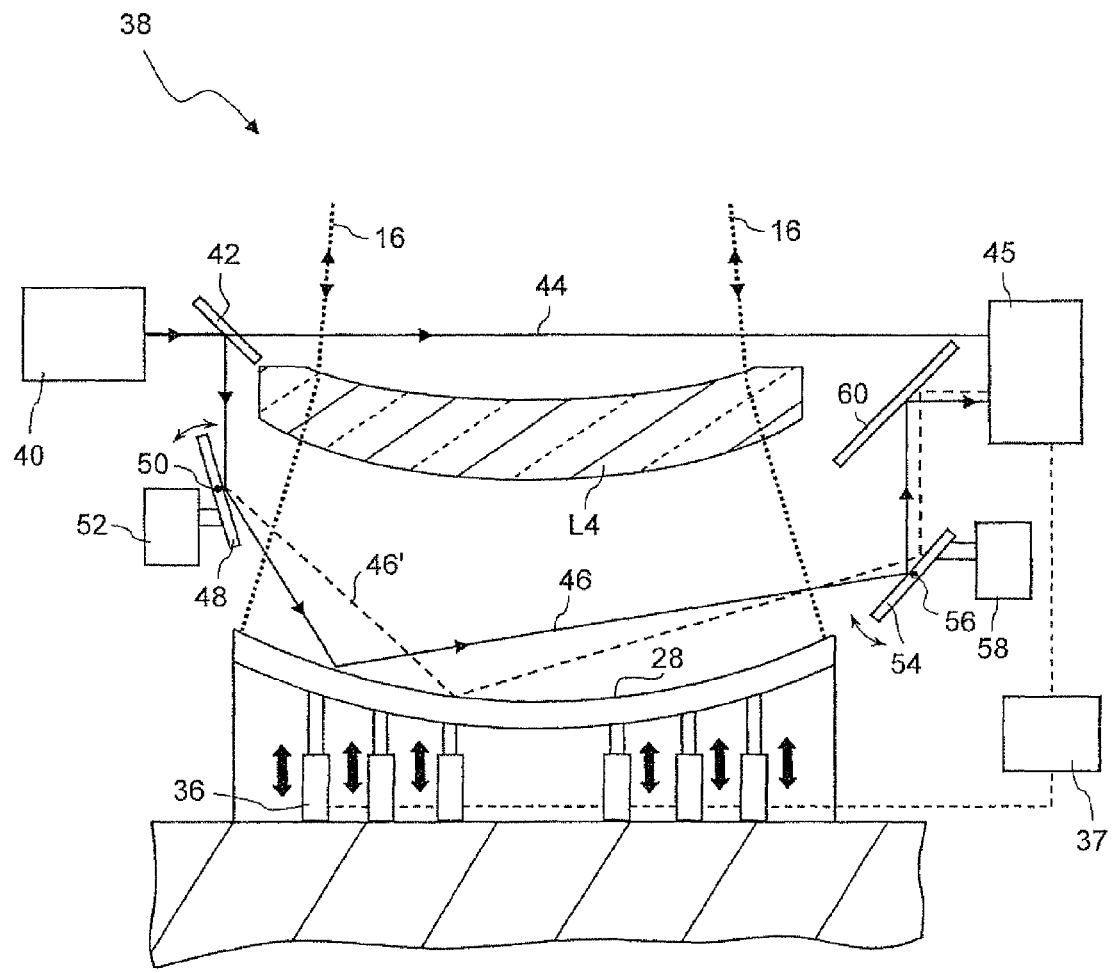
FIG. 2 shows an enlarged detail of FIG. 1, in which further details of the measuring device can be seen.
Figure 3:
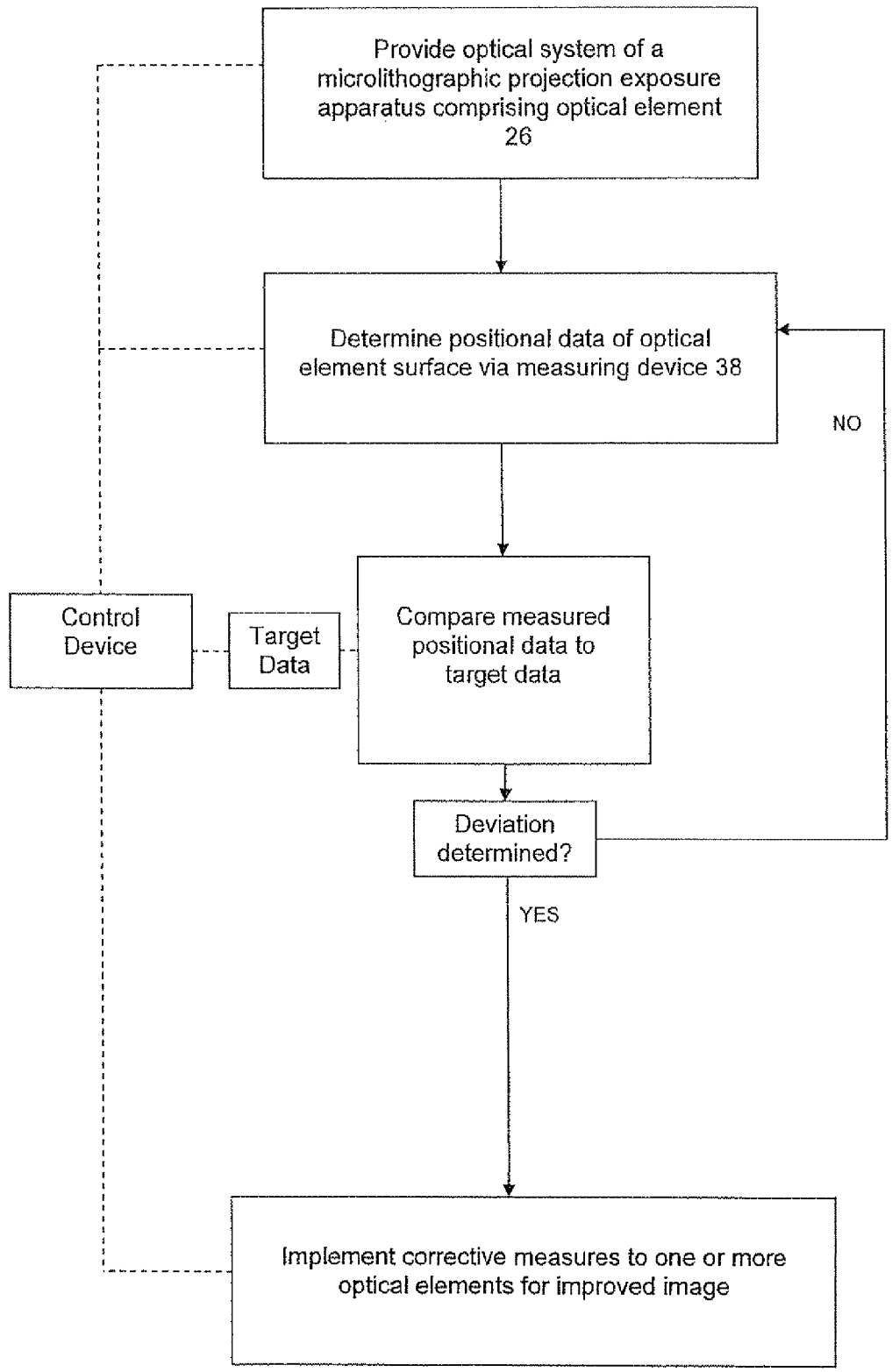
FIG. 3 is an exemplary schematic flow chart of a method for improving an imaging property of an optical system of a microlithographic projection exposure apparatus.

The mirror unit 26, which is shown with further details in FIG. 2, comprises a plurality of manipulators 36 which engage on the rear side of the mirror surface 28, not exposed to the projection light 16, so that the latter can be deformed in a controlled way. The forces required for this may, for example, be generated pneumatically, hydraulically or with the aid of piezo elements. Further details of suitable manipulators 36 can be found in EP 1 376 192 A2 that has been mentioned above and whose full disclosure is incorporated herein by reference.

The manipulators 36 are connected to a control device 37, which determines a target shape of the mirror surface 28. In the exemplary embodiment described here, the target shape is designed so as to at least partially correct time-variable imaging errors in the projection objective 10. The imaging errors which occur in the projection objective 10 may, for example, be determined by simulation. This is because the way in which individual optical elements heat up, and therefore change their shape, under the effect of the energetic projection light is generally known. From this, it is in turn possible to determine imaging errors which are caused by changes in shape or refractive index attributable to the heating.

Besides this, it is also possible to determine the time-variable imaging errors by measurements, as is known per se in the prior art. In this context, reference is made to U.S. Pat. No. 6,388,823 B1, whose full disclosure is incorporated herein by reference. Another possible way of measuring the imaging errors is to assign measuring devices at least to those surfaces which can make significant contributions to time-variable imaging errors, as will be described below with respect to the mirror surface 28. These measurement devices allow direct measurement of the shape of the surfaces, from which it is possible to deduce very precisely not only the size of the imaging errors but also their causes.

Once the time-variable imaging errors have been determined, then simulation methods known per se can be used to determine a target shape for the mirror surface 28, with which at least some of the ascertained imaging errors are at least partially corrected. The control device 37 then drives the manipulators 36 so that the mirror surface 28 obtains the previously determined target shape.

In order to ensure that the manipulators 36 actually deform the mirror surface 28 so that it obtains the previously determined target shape, the mirror surface 28 is analyzed with the aid of an optical measuring device 28 at a few selected points. The measuring device 38 is designed as an interferometric measuring device and contains a laser 40 as the light source. The laser 40 generates a coherent light beam, which is directed at a beam splitter 42. The light beam passing through the beam splitter 42 forms a reference beam 44, which strikes an interferometer 45 without having been reflected by the mirror surface 28.

The light beam reflected by the beam splitter 42 forms a measuring beam 46, which strikes a mobile deviating mirror 48 and is reflected by it in the direction of the mirror surface 28. In the exemplary embodiment represented, the deviating mirror 48 can tilt about a tilting axis indicated by 50 and is connected to an actuating device 52 for this purpose. By tilting the deviating mirror 48 about the tilting axis 50, the actuating device 52 can direct the measuring beam 46 onto different points on the mirror surface 28. In FIG. 2, a dashed line 46' indicates a measuring beam which has been directed onto the mirror surface 28 by tilting the deviating mirror 48 anticlockwise.

The measuring beam 46 reflected by the mirror surface 28 strikes a second deviating mirror 54, which can likewise tilt about a tilting axis 56. A second actuating device 58, which can tilt the second deviating mirror 54, is synchronized with the first actuating device 52 so that measuring beams 46 reflected by the second deviating mirror 54 always strike a stationary deviating mirror 60 while being mutually parallel, and are directed from there onto the interferometer 45.

By synchronous adjustment of the deviating mirrors 48, 54, it is therefore possible to analyze all points on the mirror surface 28 which lie in the plane of the paper, over a wide range. If it is also necessary to analyze points in planes parallel thereto, then it is for example possible to provide a plurality of pairs of tiltable deviating mirrors 48, 54, onto which a measuring beam is respectively directed. As an alternative to this, it is possible to mount the deviating mirrors 48, 54 in a mobile fashion so that they can also tilt about a tilting axis which lies in the plane of the paper. Since the mirror surface 28 is concavely curved, light which is directed onto the mirror surface 28 out of or into the plane of the paper by the first deviating mirror 48 will always be reflected in the direction of the second deviating mirror 54, so that its surface can be kept relatively small.

In the interferometer 45, the reference beam 44 interferes with the measuring beam 46. If the mirror surface 28 is deformed where the measuring beam 46 strikes the mirror surface 28, then this leads to a different optical path length and therefore to a different relative phase relation between the reference beam 44 and the measuring beam 46. By determining this phase relation in the interferometer 45, it is possible to measure the height of the mirror surface 28 relative to a plane perpendicular to the optical axis. If the mirror surface 28 is analyzed at a plurality of positions, then this provides a profile of the mirror surface 28 whose support points are those points where the measuring beam 44 has been reflected by the mirror surface 28.

If the control device 37 finds that there are differences between the target shape of the mirror surface 28 and the actual shape of the mirror surface 28, as determined with the aid of the measuring device 38, then it adjusts the manipulators 36 so that the actual shape becomes closer to the target shape. To this end, the control device 37 may contain a control unit as is known per se in the prior art. The control unit can make the actual shape of the mirror surface 28 replicate the target shape with a sufficient accuracy.

If the mirror surface 28 is not intended to be used to correct imaging errors which have been caused by other optical elements in the projection objective 10, then the target shape specified by the control device 37 will be the shape on which the design of the projection objective 10 was based. If the shape of the mirror surface 28 changes during operation of the projection exposure apparatus, for example due to local heating by the projection light, then the control unit 37 will drive the manipulators 36 so that the undesirable shape changes of the mirror surface 28 can be reversed. In this case as well, the measuring device 38 makes it possible to find any deviations of the shape which the manipulators 36 have actually set for the mirror surface 28 from the target shape. The control device 37 then adjusts the manipulators 36 so that the measured deviations lie below a predeterminable threshold value.

What is claimed is:

1. An optical system comprising:
   a) an optical element having a curved surface which is exposed to projection light during a projection, and
   b) a measuring device that determines positional data of a plurality of points on the surface, wherein the measuring device comprises a movable beam deviating component which is configured to direct a measuring beam sequentially onto the plurality of points on the surface of the optical element, and wherein the optical system is one of an illumination system and a projection objective contained in a microlithographic projection exposure apparatus.

2. The optical system of claim 1, wherein the measuring device determines the positional data of the plurality of points by
   directing the measuring beam sequentially on the plurality of points such that it is reflected or refracted at each of the plurality of points, and
   measuring a deflection of the reflected or refracted measuring beam.

3. The optical system of claim 2, wherein the measuring device is an interferometric measuring device, in which the measuring beam reflected or refracted at each of the plurality of points interferes with a reference beam that does not impinge on the surface of the optical element.

4. The optical system of claim 3, wherein the measuring device comprises a light source for generating coherent light and an interferometer.

5. The optical system of claim 4, wherein the measuring device comprises a beam splitter that splits the light generated by the light source into the reference beam and the measuring beam.

6. The optical system of claim 3, wherein the beam deviating component contains at least one tiltable deviating mirror.

7. The optical system of claim 1, comprising a manipulator for changing the shape of the surface.

8. The optical system of claim 7, wherein the measuring device is connected to a control device controlling the manipulator, said control device being configured to receive a target shape of the surface as a guide quantity.

9. The optical system of claim 8, wherein the target shape is determined such that the optical element causes minimal imaging errors.

10. The optical system of claim 8, wherein the target shape is determined such that the optical element at least partially corrects imaging errors caused by other optical elements.

11. The optical system of claim 1, wherein the optical element is a concave mirror disposed in or in close proximity to a pupil plane of a catadioptric projection objective.

12. A method for improving an imaging property of an optical system comprising the following steps:
   a) providing an optical system wherein the optical system is one of an illumination system and a projection objective;
   wherein the optical system is contained in a microlithographic projection exposure apparatus and comprises an optical element having a curved surface that is exposed to projection light during a projection;
   b) determining positional data of a plurality of points on the surface by directing a measuring beam sequentially onto the plurality of points on the surface by using a movable beam deviating component positioned outside of the projection light;
   c) determining deviations of the positional data from target data; and
   d) implementing corrective measures such that the imaging property of the optical system is improved.

13. The method of claim 12, wherein the positional data of the plurality of points are determined by:
   directing the measuring beam sequentially on the plurality of points such that it is reflected or refracted at each of the plurality of points and
   measuring a deflection of the reflected or refracted measuring beam.

14. The method of claim 12, wherein the corrective measures comprise a change in the position or the shape of the optical element.

15. The method of claim 13, wherein the shape of the optical element is changed so that the deviations determined in step c) lie below a predetermined threshold value.

16. The method of claim 12, wherein the corrective measures comprise a change in the position or the shape of another optical element contained in the optical system.

17. The method of claim 12, wherein the target data of the surface are determined such that the optical element causes minimal imaging errors.

18. The method of claim 12, wherein the target data of the surface are determined such that the optical element at least partially corrects imaging errors caused by other optical elements contained in the optical system.

19. The method of claim 13, wherein the positional data of the surface are determined by an interferometric measuring device, in which the measuring beam reflected or refracted at the at least one point interferes with a reference beam that does not impinge on the surface.

20. The optical system of claim 1, wherein the measuring device is arranged completely outside a beam path of the projection light so that the surface of the optical element is not shadowed by the measuring device.

21. An optical system for use in a microlithographic projection exposure apparatus having an illumination system and a projection objective, the optical system comprising:
   a) an optical element positioned in a microlithographic projection exposure apparatus, the optical element having a curved surface which is exposed to projection light during a projection; and
   b) a measuring device producing a measuring beam and comprising at least one tiltable mirror which is configured to direct the measuring beam sequentially onto a plurality of points on the surface of the optical element so as to determine positional data of the plurality of points on the surface of the optical element.

22. An optical system for use in a microlithographic projection exposure apparatus having an illumination system and a projection objective, the optical system comprising:
   a) an optical element positioned in a microlithographic projection exposure apparatus, the optical element having a curved surface which is exposed to projection light during a projection; and
   b) a measuring device that determines positional data of a plurality of points on the surface, wherein the measurement device is completely arranged outside a beam path of the projection light.

23. An optical system for use in a microlithographic projection exposure apparatus having an illumination system and a projection objective, the optical system comprising:
   an optical element positioned in one of an illumination system and a projection objective of a microlithographic projection exposure apparatus, the optical element having a curved surface which is exposed to projection light during a projection;
   a measuring device which is positioned outside a beam path of the projection light and which comprises:
   a light source producing coherent measuring light,
   a first tiltable deviating mirror that selectively directs the measuring light to at least one point on the surface of the optical element,
   a second tiltable deviating mirror that is synchronized with the first tiltable mirror and directs the measuring light reflected from the at least one point on the surface towards an interferometer in which the measuring light reflected from the at least one point on the surface interferes with a reference beam that does not impinge on the surface of the optical element.

* * * * *

UNITED STATES PATENT AND TRADEMARK OFFICE
CERTIFICATE OF CORRECTION

PATENT NO.        : 7,733,501 B2                                    Page 1 of 1
APPLICATION NO.   : 12/195920
DATED             : June 8, 2010
INVENTOR(S)       : Joerg Tschischgale It is certified that error appears in the above-identified patent and that said Letters Patent is hereby corrected as shown below:

Title page, Item (75), Column 1, Line 6, delete "Joerge" insert -- Joerg --.

Column 4, Line 36, delete "light" insert -- light, --.

Column 5, Line 4, delete "seen." insert -- seen; --.

Signed and Sealed this

Twenty-eighth Day of September, 2010

David J. Kappos
*Director of the United States Patent and Trademark Office*